United States Patent
Sukkau et al.

(10) Patent No.: US 10,386,434 B2
(45) Date of Patent: Aug. 20, 2019

(54) AUTOMATIC SHIMMING BY OPTIMIZING THE FREQUENCY ADJUSTMENT

(71) Applicant: Siemens Healthcare GmbH, Erlangen (DE)

(72) Inventors: Johann Sukkau, Herzogenaurach (DE); Michael Wullenweber, Erlangen (DE); Daniel Niederloehner, Erlangen (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 15/907,327

(22) Filed: Feb. 28, 2018

(65) Prior Publication Data
US 2018/0252786 A1 Sep. 6, 2018

(30) Foreign Application Priority Data
Mar. 2, 2017 (DE) .................. 10 2017 203 425

(51) Int. Cl.
*G01R 33/54* (2006.01)
*G01R 33/565* (2006.01)

(52) U.S. Cl.
CPC ..... *G01R 33/543* (2013.01); *G01R 33/56563* (2013.01)

(58) Field of Classification Search
CPC ............ G01R 33/543; G01R 33/56563; G01R 33/5659; G01R 33/483
See application file for complete search history.

(56) References Cited

U.S. PATENT DOCUMENTS 5,677,626 A * 10/1997 Miyazaki ........... G01R 33/4835
324/307

2008/0088307 A1 4/2008 Dewdney et al.
2015/0301135 A1 10/2015 Biber et al.
2015/0355306 A1 12/2015 Stemmer
2016/0209484 A1 7/2016 Bauer et al.

FOREIGN PATENT DOCUMENTS

| DE | 102006048423 A1 | 4/2008 |
| DE | 102014207314 A1 | 10/2015 |
| DE | 102014210778 A1 | 12/2015 |
| DE | 102015200695 A1 | 7/2016 |

OTHER PUBLICATIONS

German Office Action. Published Nov. 9, 2017.
German Office Action and English translation thereof dated Nov. 9, 2017.
German Decision to Grant and English translation thereof dated Jul. 18, 2018.

* cited by examiner

*Primary Examiner* — Rishi R Patel
(74) *Attorney, Agent, or Firm* — Harness, Dickey & Pierce, P.L.C.

(57) ABSTRACT

A method is for carrying out an automatic adjustment of an MR system, including a number of receive coils. In such cases, a number of partial spectra in a number of receive coils are measured for an excitation volume of an examination object. The number of partial spectra are evaluated via an algorithm, at least one characteristic value being determined for each partial spectrum and a decision being further made with the aid of the number of characteristic values to determine whether the partial spectra fulfill a quality criterion. Finally, adjustment parameters of the MR system are optimized on the basis of the number of partial spectra.

20 Claims, 3 Drawing Sheets

FIG 2

AUTOMATIC SHIMMING BY OPTIMIZING THE FREQUENCY ADJUSTMENT

PRIORITY STATEMENT

The present application hereby claims priority under 35 U.S.C. § 119 to German patent application number DE 102017203425.4 filed Mar. 2, 2017, the entire contents of which are hereby incorporated herein by reference.

FIELD

At least one embodiment of the present invention generally relates to a method for carrying out an automatic adjustment of an MR system and/or the associated MR system herefor; and furthermore generally relates to a computer program product and/or an electronically readable data carrier.

BACKGROUND

Known MR methods, such as rapid imaging methods (echo planar imaging, EPI) and in particular spectroscopy applications place high demands on the homogeneity of the basic or polarization field B0. The individual body of each patient deforms the local field.

In order to be able to apply the methods, however, what is known as "in vivo shimming" is carried out in a patient-specific manner, i.e. the MR system is adjusted to the examined person. In this regard, with conventional methods the local B0 field in the examination region is firstly measured, to create what is known as a B0 map, and on the basis of the B0 map, DC offset currents for the three gradient coils and currents for special shim coils of a higher order are then calculated, such that the local field distortions are compensated in the best way possible. After adjusting these currents, an HF resonance frequency for the desired spectral component of the examined tissue (generally protons bound to water) is generally determined in a frequency adjustment.

The fineness with which the local B0 field inhomogeneities are compensated depends primarily on the number and order of the existing (and usable) shim channels. With modern MR systems, the linear terms x, y and z are generally generated via static offset currents of the three gradient coils. Due to the linear field profile along the gradient direction, the term shim channels of the first order is also used.

Furthermore, many modern MR devices have dedicated shim coils here. These shim coils are frequently designed such that the fields generated thereby can be described by spherical harmonics. The shim channels of the second order comprise for instance 5 shim coils which generate fields, the spatial course of which can be described in good approximation by z2 (channel M4/A20), xz (channel M5/A21), yz (channel M5/A21), x2−y2/2 (channel M6/B21), xy (channel M8/B22).

With conventional methods, there is a special user interface for frequency adjusting the shim settings, in order to perform manual optimizations (what is known as IntShim). A constantly repeating measurement of the frequency spectrum can be started in this user interface, wherein a conventional repetition time amounts to approx. 1 s. The frequency spectrum determined in the adjustment volume (adjust volume, AdjVol) is indicated with a sufficiently high spectral resolution.

The user can now optimize the shim state by manually adjusting the shim settings, by always iteratively further improving the shim state. The width of the peaks in the spectrum is typically used as a quality criterion to determine the quality of the shim state, the half value width (full width at half maximum, FWHM) is typically used as a quantitative variable. Adjustment parameters for this procedure are the three piece gradients (linear or 1st order spherical harmonics) and five piece E-shim (square or 2nd order spherical harmonics) or more if channels of the 3rd order or higher are used.

SUMMARY

The inventors have recognized that an improved automatic optimization of the shim state is necessary, since on the one hand a manual iterative procedure is complex in the case of a total of 8 parameters and is thus too time-consuming and unsuitable for a manual adjustment. On the other hand, it is unclear with the manual adjustment whether the optimal state was actually reached at the end. The object of the invention therefore consists in reliably achieving good shim settings in a predictable time.

Embodiments of the invention are described in the claims.

According to a first embodiment, there is provision for a method for carrying out an automatic adjustment of an MR system, which has several receive coils. In such cases, adjustment parameters for a predetermined excitation volume of an examination object are set in a first step. In a further step, a number of partial spectra in the number of receive coils are measured for the excitation volume of the examination object. In an additional step, the number of partial spectra are evaluated via an algorithm, wherein at least one characteristic value is determined for each partial spectrum and a decision is made with the aid of the number of characteristic values to determine whether the partial spectra fulfill a predetermined quality criterion. The adjustment parameters for the excitation volume of the examination object are then optimized by an algorithm, and the above steps are repeated with the optimized adjustment parameters if the quality criterion is not fulfilled. In a further step, MR signals from the excitation volume are measured by applying the adjustment parameters, if the quality criterion is fulfilled.

According to a further embodiment of the invention, an MR system is embodied to carry out an automatic adjustment of the MR system, wherein the MR system has a control unit, a storage unit and a number of receive coils. In such cases the storage unit stores control information which can be executed by the control unit. Furthermore, the MR system is embodied such that when control information is executed in the control unit, it adjusts adjustment parameters for a predetermined excitation volume of an examination object, measures a number of partial spectra in the number of receive coils for the excitation volume of the examination object and evaluates the number of partial spectra via an algorithm. In such cases at least one characteristic value is determined for each partial spectrum, and with the aid of the number of characteristic values a decision is made as to whether the partial spectra fulfill a predetermined quality criterion. Furthermore, the MR system is embodied such that when the control information is executed in the control unit, it optimizes adjustment parameters for the excitation volume of the examination object via an algorithm, and repeats the steps of adjusting, measuring and evaluating with the optimized adjustment parameters if the quality criterion is not fulfilled, and measures MR signals from the excitation volume by using the adjustment parameters if the quality criterion is fulfilled.

According to a further embodiment of the invention, a computer program product comprises a program which can be loaded directly into a storage device of an MR control unit of an MR system, having program segments to carry out the steps of an embodiment of the afore-described method, when the program is executed in the control unit of the MR system.

According to an additional embodiment of the invention, an electronically readable data carrier has electronically readable control information stored thereupon, which is configured such that it carries out embodiments of the afore-described method when the data carrier is used in an MR control unit of an MR system.

BRIEF DESCRIPTION OF THE DRAWINGS

The invention is explained in more detail below with reference to the appended drawings.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to a first embodiment, there is provision for a method for carrying out an automatic adjustment of an MR system, which has several receive coils. In such cases, adjustment parameters for a predetermined excitation volume of an examination object are set in a first step. In a further step, a number of partial spectra in the number of receive coils are measured for the excitation volume of the examination object. In an additional step, the number of partial spectra are evaluated via an algorithm, wherein at least one characteristic value is determined for each partial spectrum and a decision is made with the aid of the number of characteristic values to determine whether the partial spectra fulfill a predetermined quality criterion. The adjustment parameters for the excitation volume of the examination object are then optimized by an algorithm, and the above steps are repeated with the optimized adjustment parameters if the quality criterion is not fulfilled. In a further step, MR signals from the excitation volume are measured by applying the adjustment parameters, if the quality criterion is fulfilled.

In the case of MR spectroscopy applications, or other applications, in which no compromise can be accepted in respect of shim quality or a good shim is required, the optimal shim state is found in an advantageously reproducible manner by the inventive method. This also accelerates the operating cycle during an examination, since manual intervention is not required. Furthermore, the method can likewise be carried out by a less experienced and/or less trained skilled person. By evaluating a number of partial spectra of a number of receive channels or a number of receive coils, the quality and thus the homogeneity of the shimming of the B0 field can be determined more accurately and the measurements triggered spatially more accurately than with conventional methods with just one receive channel or one receive coil.

A particularly rapid convergence can also be achieved so that the inventive method can be employed as an exclusive shim method. Moreover, the measurement time of a magnetic field distribution (B0 mapping) can be saved, for instance. A concluding frequency adjustment, such as with the conventional shimming, is no longer necessary with the method according to an embodiment of the present invention.

Furthermore, an embodiment of the inventive method can save on development costs of an industrial product, by indicating whether a calculated shim setting actually already shows the optimum or how far the shim settings are from the optimum.

The number of characteristic values can have half value widths of the number of partial spectra, wherein the quality criterion is then fulfilled if a sum, a square sum or an average value of the half value widths of the partial spectra lies below a predetermined threshold value and/or the positions of the various center frequencies lie within a predetermined frequency interval. By taking a sum, a square sum or an average value into account, a convergence can be achieved easily and quickly.

The number of characteristic values can have center frequencies of the number of partial spectra, wherein a center frequency is determined for each partial spectrum and wherein the quality criterion is fulfilled if the variance in the center frequencies or the average square distance of all center frequencies from a global center frequency, which is determined from the partial spectra of all receive coils, lies below a predetermined threshold value. By using center frequencies within the method, a further optimization of the adjustment parameters can be carried out easily and quickly since space-resolved information, which provides statements relating to the B0 field, exists as a result of various receive coils.

The evaluation of the number of partial spectra can comprise a summation of all partial spectra to form an overall spectrum, wherein the quality criterion is fulfilled if a half value width of the measured overall spectrum lies below a predetermined threshold value. An optimization of the adjustment parameters can be carried out particularly easily and quickly by calculating an overall spectrum.

The adjustment parameters can be optimized by way of a brute force approach, in which the entire solution space is scanned uniformly. A brute force algorithm ensures that the absolute optimum of the shim settings is found.

The adjustment parameters can be optimized via a genetic algorithm, in particular by way of an initial random choice of adjustment parameters and a scanning of the solution space with the aid of a genetic algorithm. A genetic algorithm allows for a particularly rapid convergence to a global optimum within the solution space.

The adjustment parameters can be optimized via an optimization algorithm, in particular by scanning the solution space with the aid of a gradient descent method. A gradient descent method allows the optimum of the shim settings to be found particularly quickly.

For at least one receive coil, a spatial position of the at least one receive coil and/or of the receive volume can be determined relative to the examination object, wherein the adjustment parameters are optimized on the basis of the spatial position of the at least one receive coil/of the receive volume. By taking the spatial position of the receive coil/the receive volume into account, a particularly rapid convergence of the method can be achieved, since information exists as to the direction in which an adjustment of the field is required.

Based on the spatial position of the at least one receive coil or receive volume, a selection of adjustment parameters can be made, wherein when the adjustment parameters are optimized the selected adjustment parameters are optimized on the basis of the spatial position. A particularly rapid convergence of the method can be achieved by optimizing the selected adjustment parameters on the basis of the spatial position of the at least one receive coil.

A direction can be determined on the basis of the spatial position of the at least one receive coil or the receive volume, wherein the selected adjustment parameters are optimized on the basis of the determined direction such that the partial spectrum of the at least one receive coil, which is in the determined direction, fulfills the quality criterion. As a result of the selected adjustment parameters being optimized on the basis of the determined direction such that the partial spectrum of the at least one receive coil, which is in the determined direction, fulfills the quality criterion, an additional particularly rapid convergence of the method can be achieved.

Adjustment parameters, which are assigned to shim channels with a stabilization time above a predetermined threshold value, can only be redetermined after a predetermined number of repetitions. A particularly rapid convergence of the method can be achieved by optimization only after a predetermined number of repetitions.

The course of the characteristic values used can be displayed visually to a user of the MR system on a graphical user interface or a display. By graphically displaying the course of the characteristic values used, the user can monitor and if necessary cancel the procedure if an obvious error occurs. Moreover, the user can cancel the method prematurely if the course of the characteristic values does not converge, if a quality criterion is already adequately reached, yet not a cancellation criterion, or if it is foreseeable that the optimization is already converged, but will converge no further.

According to a further embodiment of the invention, an MR system is embodied to carry out an automatic adjustment of the MR system, wherein the MR system has a control unit, a storage unit and a number of receive coils. In such cases the storage unit stores control information which can be executed by the control unit. Furthermore, the MR system is embodied such that when control information is executed in the control unit, it adjusts adjustment parameters for a predetermined excitation volume of an examination object, measures a number of partial spectra in the number of receive coils for the excitation volume of the examination object and evaluates the number of partial spectra via an algorithm. In such cases at least one characteristic value is determined for each partial spectrum, and with the aid of the number of characteristic values a decision is made as to whether the partial spectra fulfill a predetermined quality criterion. Furthermore, the MR system is embodied such that when the control information is executed in the control unit, it optimizes adjustment parameters for the excitation volume of the examination object via an algorithm, and repeats the steps of adjusting, measuring and evaluating with the optimized adjustment parameters if the quality criterion is not fulfilled, and measures MR signals from the excitation volume by using the adjustment parameters if the quality criterion is fulfilled.

In the case of MR spectroscopy applications, or other applications in which no compromise can be accepted with respect to shim quality, the MR system finds the optimal shim settings in an automated and reproducible manner. This furthermore benefits an operating cycle during an examination via the MR system, since there is no need to manually set the shim settings. Moreover, contrary to a conventional MR system, the MR system can be operated by a less experienced and/or less trained skilled person.

Furthermore, the MR system achieves a particularly rapid convergence, as a result of which the examination times for examination persons are reduced. As a result, the examination costs for an examination object are effectively reduced.

According to a further embodiment of the invention, a computer program product comprises a program which can be loaded directly into a storage device of an MR control unit of an MR system, having program segments to carry out the steps of an embodiment of the afore-described method, when the program is executed in the control unit of the MR system.

According to an additional embodiment of the invention, an electronically readable data carrier has electronically readable control information stored thereupon, which is configured such that it carries out embodiments of the aforedescribed method when the data carrier is used in an MR control unit of an MR system.

At least one embodiment of the present invention relates to a method for carrying out an automatic adjustment of an MR system and associated MR system. Many MR methods, such as rapid imaging methods (echo planar imaging, EPI) or in particular MR spectroscopy applications place high demands on the homogeneity of the basic or polarization field B0. An adjustment of the MR system, based on a consideration of a number of partial spectra of a number of receive coils and a determination of characteristic values of the number of partial spectra is a complex problem with a total of 8 parameters and is therefore to be carried out advantageously by an improved adjustment process according to at least one embodiment of the present invention.

Figure 1:
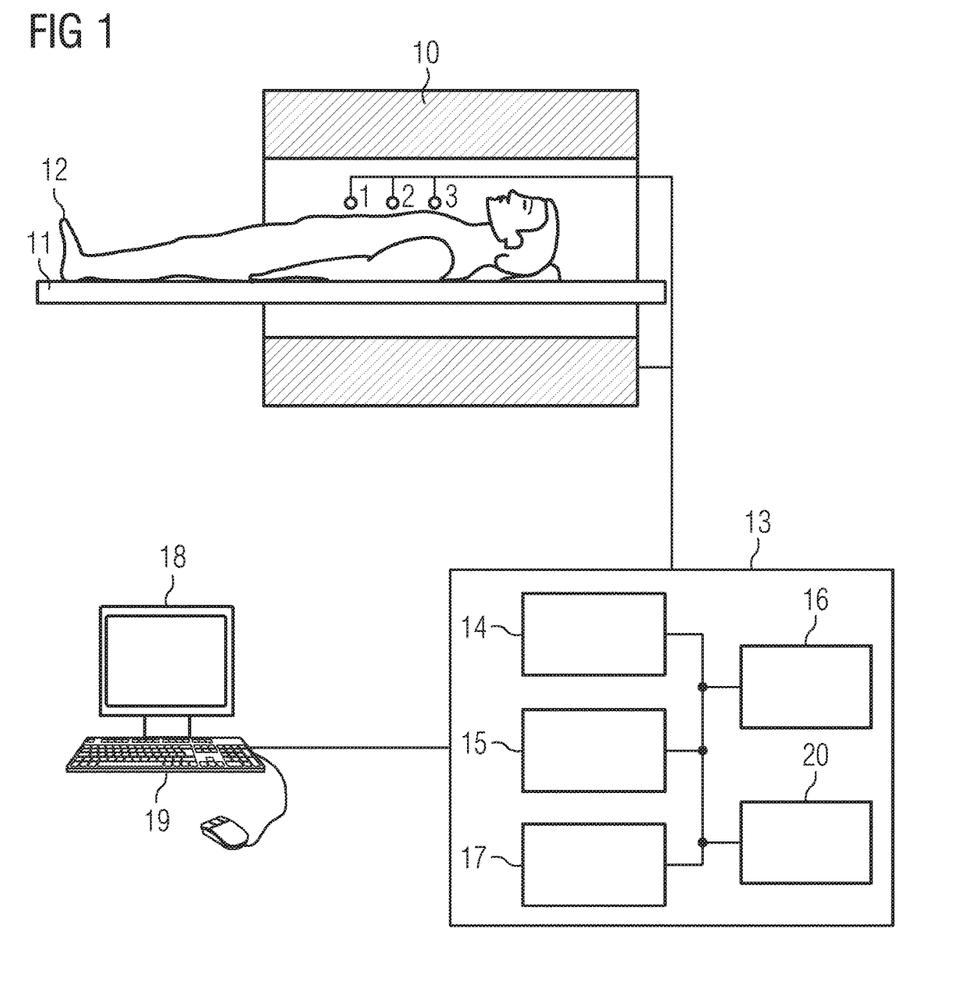
FIG. 1 schematically shows an MR system, with which an automatic adjustment can be inventively carried out.

FIG. 1 schematically shows an MR system, with which an automatic adjustment can be inventively carried out. An examination person 12, or more generally an examination object, is moved into the tunnel of the system. The magnetic resonance system has a magnet 10 for generating a basic field B0, wherein an examination person 12 arranged on a couch 11 is moved into the center of the magnet, in order there to record spatial encoded magnetic resonance signals from an examination section. By irradiating high frequency pulse sequences and switching magnetic field gradients, the magnetization generated by the basic field B0 can be disturbed by deflecting the nuclear spins from the equilibrium position, and the currents inducted into the receive coils 1, 2, 3 when returning into the equilibrium position can be converted into magnetic resonance signals. The number of receive coils may be any number and is not restricted to three receive coils 1, 2, 3. The general mode of operation for creating MR images and detecting the magnetic resonance signals are known to the person skilled in the art, so that a detailed explanation of this is dispensed with.

The magnetic resonance system also has an MR control unit 13 which is used for controlling the MR system. The central MR control unit 13, which is embodied such that it carries out the method described below for an automatic adjustment, has a gradient controller 14 for controlling and switching the magnetic field gradients, and an RF controller 15 for controlling and irradiating the RF pulses for deflecting the nuclear spins from the equilibrium position. By way of example, the imaging sequences needed for recording the MR images along with all programs needed to operate the MR system can be stored in a storage unit 16.

A recording unit 17 controls the image recording and thus controls the sequence of magnetic field gradients and RF pulses and the receive intervals of MR signals as a function of the selected imaging sequences. The recording unit 17 therefore also controls the gradient controller 14 and the RF controller 15. MR images that can be displayed on a display 18 can be calculated in a computing unit 20, wherein an operator can operate the MR system by way of an input unit 19. The storage unit 16 can have imaging sequences and program modules, which carry out the inventive method upon execution in the computing unit 20 of one of the modules shown.

The MR control unit 13 can also be embodied to improve an adjustment of the MR system, as explained in detail below. In particular, the storage unit 16 stores control information which can be executed by the MR control unit 13. Furthermore, the recording unit 17 is embodied such that it can carry out the adjustment described below. The adjustment parameters, as explained below, can be optimized in the computing unit 20. Furthermore, the MR system comprises three receive coils 1, 2, 3, which have different spatial positions relative to the examination object. The spatial positions of the receive coils 1, 2, 3 can either be predetermined, and thus known prior to starting the automatic adjustment, or determined by sensors. In such cases the spatial positions of the receive coils 1, 2, 3 can be measured continuously, so that the spatial positions of the receive coils 1, 2, 3 can be determined during the automatic adjustment of the present invention.

A basic field map is initially calculated, which, e.g. as a B0 map $\Delta B0(x,y,z)$, reproduces the local variance in the field from the B0 field of the system or as a frequency map $\Delta f0(x,y,z)$ the local variance in the resonance frequency of a spectral component of the examination tissue in each case within the examination region. How this field map is measured is not relevant to the method; different methods herefor are known, however, inter alia that disclosed in DE 102014210778 A1, the entire contents of which are incorporated herein by reference. As explained below, the inventive method can however also be carried out without determining a preceding field map.

The object of shimming is to determine shim currents such that the fields generated by the shim currents compensate in the best way possible for the field variances reproduced by the basic field map for a predetermined excitation volume. Here the predetermined excitation volume is a subregion of the examination object, in which the field variances are to be minimized.

In accordance with at least one embodiment of the invention, the MR system in FIG. 1 is embodied to carry out an automatic adjustment of the MR system, wherein the MR system has receive coils 1, 2, 3. Furthermore, the MR system is embodied such that it adjusts and optimizes adjustment parameters for a predetermined excitation volume of an examination object when the control information is executed in the MR control unit 13. Here the MR system comprises three receive coils 1, 2, 3, wherein the number of receive coils is not restricted to three receive coils, but can instead have any number of receive coils in any spatial arrangements around the examination person 12.

An example embodiment has three receive coils 1, 2, 3. The MR system measures further partial spectra S1, S2, S3 in the receive coils 1, 2, 3 for the excitation volume of the examination object. The partial spectra S1, S2, S3 are evaluated via an algorithm, which can be carried out in the computing unit 20. In such cases at least one characteristic value is determined for each partial spectrum S1, S2, S3, and with the aid of the number of characteristic values a decision is made to determine whether the partial spectra S1, S2, S3 fulfill a predetermined quality criterion. Furthermore, the MR system is embodied such that when the control information is executed in the MR control unit 13, it optimizes adjustment parameters for a frequency adjustment of shim settings of the B0 field of the magnet 10 via an algorithm. Here the optimization algorithm can likewise be executed in the computing unit 20. The MR system repeats the steps of adjustment, measurement and evaluation with the optimized adjustment parameters. If the quality criterion is fulfilled, the MR system receives MR signals from the examination person 12.

Figure 2:
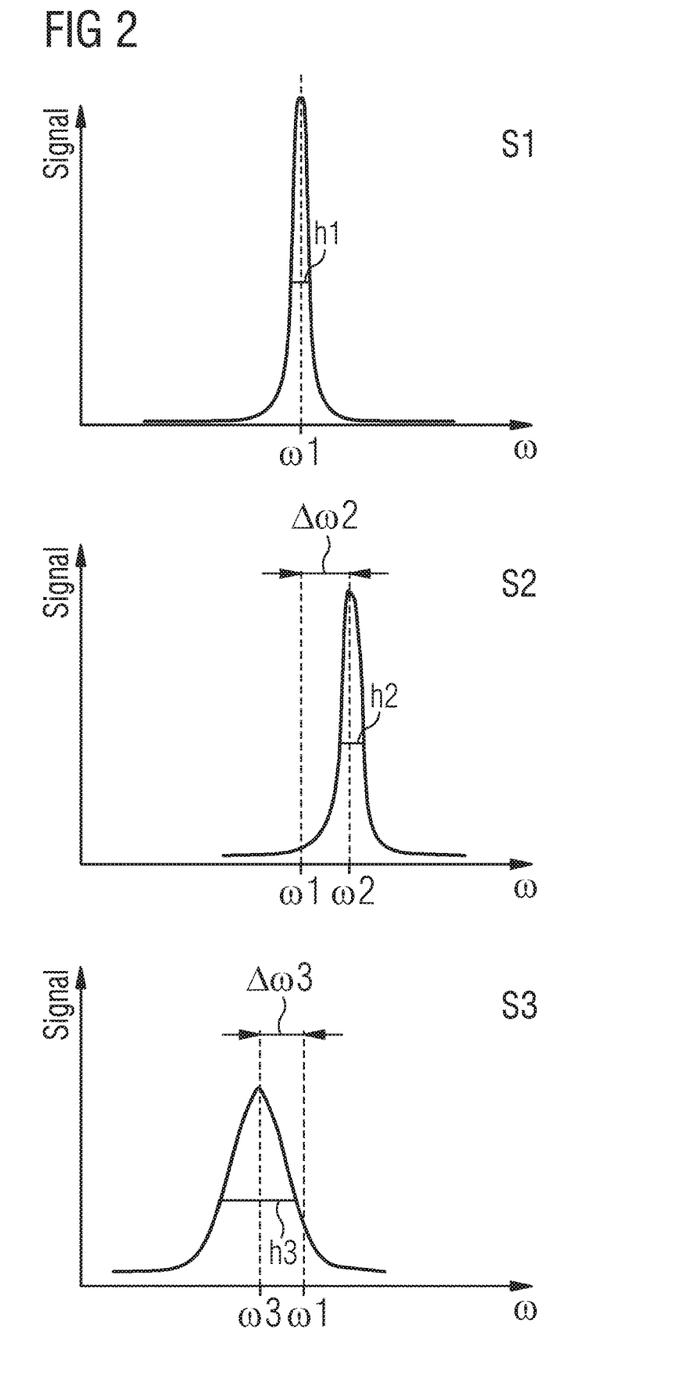
FIG. 2 shows partial spectra of a number of receive coils of an MR system, which have different spatial positions relative to an examination object.

FIG. 2 shows partial spectra S1, S2, S3 of receive coils 1, 2, 3 of an MR system, which have different spatial positions relative to an examination object 12.

The three partial spectra S1, S2, S3 are assigned to three different receive coils 1, 2, 3 in the MR system. In such cases the partial spectra S1, S2, S3 each comprise the hydrogen peak of the respective receive coils 1, 2, 3.

The partial spectrum S1 has a narrow shape, wherein the center frequency of the partial spectrum S1 assumes the value ω1. Furthermore, the partial spectrum S1 has a half value width h1. Accordingly, the partial spectrum S2 has a center frequency ω2, and a half value width h2, and the partial spectrum S3 has a center frequency ω3 as well as a half value width h3.

The center frequency ω2 of the receive coil 2 is displaced by Δω2 compared with the center frequency ω1 of the receive coil 1. The center frequency ω3 of the receive coil 3 is displaced by Δω3 compared with the center frequency ω1 of the receive coil 1. Furthermore, the partial spectrum S3 has a larger half value width h3 than the two partial spectra S1 and S2.

Figure 3:
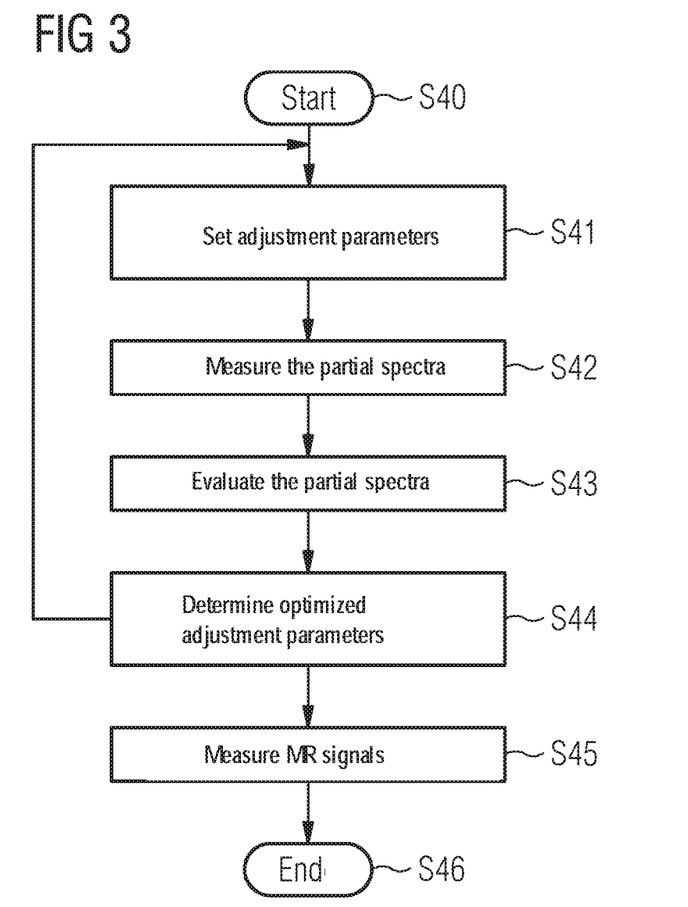
FIG. 3 shows a flow chart with steps for carrying out an automatic adjustment of an MR system according to an inventive embodiment.

FIG. 3 shows a flow chart with steps for carrying out an automatic adjustment of an MR system according to an inventive embodiment.

The method begins with step S40. In step S41, adjustment parameters for a predetermined excitation volume of an examination object are set. The adjustment parameters correspond to the shim channels of the first order in the x, y and z direction as well as the shim channels of the second order. The shim channels of the second order here comprise for instance five shim coils, which generate fields, the spatial course of which can be described in good approximation by z2 (channel M4/A20), xz (channel M5/A21), yz (channel M5/A21), x2-y2/2 (channel M6/B21), xy (channel M8/B22).

In step S42, a number of partial spectra S1, S2, S3 are measured in the receive coils 1, 2, 3 for the excitation volume of the examination object 12. In such cases a frequency spectrum of the examination object 12 is recorded in each of the receive coils 1, 2, 3. For instance, the partial spectra can result directly from the different spatial receive sensitivities:

If a body coil with e.g. 2×2 planar coil elements rests on the front of the torso, then the upper elements receive signals above all from the region of the shoulders (one from the right shoulder and one from the left shoulder). The lower two elements would then receive more from the abdomen, either to the left or to the right.

In step S43, the partial spectra S1, S2, S3 are evaluated via an algorithm, wherein at least one characteristic value is determined for each partial spectrum S1, S2, S3. Characteristic values can be the half value widths h1, h2, h3 for instance, or the center frequencies ω1, ω2 and ω3 for instance. With the aid of the number of characteristic values, a decision is made to determine whether the partial spectra S1, S2, S3 fulfill a predetermined quality criterion. For instance, the variances Δω2 and Δω3 in the center frequencies ω2 and ω3 from the center frequency ω1 can be determined in order to calculate a characteristic value. The square sum of the variances Δω2 and Δω3 can represent a characteristic value of this type, which lies below a predetermined threshold value or is minimal, so that the quality criterion is fulfilled.

In one example embodiment, half value widths h1, h2 and h3 of the individual partial spectra S1, S2, S3 are determined when at least one characteristic value is determined. Here the quality criterion consists of a sum, a square sum or an average value of the half value widths h1, h2 and h3 of the partial spectra S1, S2, S3 lying below a predetermined threshold value or being minimal.

In a further example embodiment, center frequencies ω1, ω2 and ω3 of the partial spectra S1, S2, S3 are determined when at least one characteristic value is determined. The quality criterion consists here in the variance of the center frequencies ω1, ω2 and ω3 of the partial spectra S1, S2, S3 or the average square distance of all center frequencies ω1, ω2 and ω3 of the partial spectra S1, S2, S3 from a global center frequency lying below a predetermined threshold value, or being minimal. The global center frequency is determined from the partial spectra S1, S2, S3 of the receive coils 1, 2, 3 via an average value or a weighted average value of all center frequencies ω1, ω2 and ω3 of the partial spectra S1, S2, S3 for instance.

The center frequencies ω1, ω2 and ω3 correspond to the positions of the water peak in the spectra of the individual receive coils 1, 2, 3, therefore the frequency of the hydrogen core or "water frequency" bound in the water. With an optimal shim state, these are identical. The variance in the water frequencies or alternatively the average square distance of all water frequencies from the global water frequencies can therefore be used as a quantitative measure of the quality of the shim settings. Further metrics are conceivable, which possibly accelerate a convergence of the method.

Instead of a half value width h1, h2, h3, each further quantitative measure can be used as a criterion for the width of the peaks in the partial spectra S1, S2, S3.

The afore-cited criteria will all finally provide an optimal shim state. The difference is produced above all in the speed of the convergence of the overall sequence and can also further be reflected in the quality of the optimum. The speed of a convergence and quality of the optimum are opposing criterion here so that the person skilled in the art will weigh up the two for, in the present application, use of at least one of the inventive method and at least one of the inventive MR system.

In a further example embodiment, an overall spectrum is calculated when at least one characteristic value is determined, in which all partial spectra S1, S2, S3 are summed up. In such cases the quality criterion is fulfilled if a half value width of the measured overall spectrum lies below a predetermined threshold value or is minimal.

In step S44, the adjustment parameters for the excitation volume of the examination object are redetermined via an algorithm and optimized here. In one example embodiment, the adjustment parameters are optimized by a brute force approach, in which the overall solution space is scanned uniformly. In a further example embodiment, the adjustment parameters are optimized via a genetic algorithm. In such cases in particular initially random adjustment parameters are selected and the solution space is scanned with the aid of a genetic algorithm.

Genetic algorithms are an abstraction of mechanisms, which in nature result in the evolution of living beings, by the genome of a population adjusting to the environment over time (=optimization). Optimizing the shim parameters means that an "individual" corresponds to a possible solution of the best shim object and can be summarized as a vector comprising 8 doubles. In such cases the "genetic information" consists of three linear and the fifth second order shim thermae. A "population" is a quantity of such individuals, which effectively achieve the set object in a variety of ways. It is a type of memory of all solution candidates already considered. The "evolution" consists of three steps which are repeated and bring about new generations until an acceptable individual has been found. This corresponds to a recombination, a mutation and a selection. The recombination generates new individuals by mixing the shim thermae of already existing individuals. For instance, by forming averages from both parents, or by picking out individual thermae from one of the parents. The mutation changes the shim thermae of the new individuals at least marginally. The selection evaluates the quality of all new individuals and corrects their probability of recombination in the next generation upward or downward.

In a further example embodiment, the adjustment parameters are optimized by an optimization algorithm, in particular by scanning the solution space with the aid of a gradient descent method. With a gradient descent method, initial random adjustment parameters are selected and a local minimum is found on the basis of these adjustment parameters. However, other optimization algorithms are also conceivable.

One spatial position of the at least one receive coil 1, 2, 3 relative to the examination object is determined for at least one receive coil 1, 2, 3. The positions of the receive coils 1, 2, 3 can be known here from the setup of the MR system or can be measured by sensors on the receive coils 1, 2, 3. The adjustment parameters are optimized on the basis of the spatial position of the at least one receive coil 1, 2, 3. In a further example embodiment, a selection of adjustment parameters is made on the basis of the spatial position of the at least one receive coil 1, 2, 3. The selection is made in that the information relating to the spatial positions of the respective receive coils is taken into account in order to reinforce or firstly adjust selected adjustment parameters. In another example embodiment, one direction is determined on the basis of the spatial position of the at least one receive coil 1, 2, 3 and the selected adjustment parameters are optimized on the basis of the determined direction such that the partial spectrum or the partial spectra S1, S2, S3 of the at least one receive coil 1, 2, 3, which lie in the determined direction, fulfil/s the quality criterion. If it is known from the coil-by-coil evaluation for instance that the center frequencies of accordingly positioned receive coils 1, 2, 3 are greater in the positive X-direction, by the center frequencies being displaced accordingly spectrally, the optimization algorithm can intentionally adjust and reduce the X-gradients accordingly.

The steps S41, S42 and S43 are repeated with the optimized adjustment parameters if the quality criterion in step S44 is not fulfilled.

In one embodiment, adjustment parameters which are assigned to shim channels with a stabilization time above a predetermined threshold value, are only redetermined after a predetermined number of repetitions. A rapid repetition time of the overall process, which consists of measuring, calculating and setting, is desirable. This can be restricted by shim channels, which couple robustly to the basic magnetic field B0 for example the A20 term. Therefore the system must always wait until the stabilization time of these channels has elapsed. In order to use this time and at the same time not to generate divergent behavior, these channels with stabilization time can only be adjusted each n'th iteration.

In an additional example embodiment, the course of the characteristic values used, for instance the FWHM values, is shown visually on a graphic user interface or a display 18 to a user of the MR system by way of the continuous iterations. The user can employ this to monitor the method carried out and also to cancel the method prematurely. A premature cancellation may be desirable if the course of the characteristic values does not converge, if a quality criterion is already sufficiently reached, but yet not a cancellation criterion, or if it is foreseeable that the optimization is already converged but will converge no further.

In step S45, MR signals from the excitation volume are measured by applying the adjustment parameters, if the quality criterion is fulfilled. The method ends in step S46.

In summary, a method of an embodiment for carrying out an automatic adjustment of an MR system, which has a number of receive coils, is shown in order to compensate for local B0 field inhomogeneities. In such cases, a number of partial spectra in a number of receive coils are measured for a predetermined excitation volume of an examination object, the number of partial spectra are evaluated via an algorithm, wherein at least one characteristic value is determined for each partial spectrum and wherein a decision is further made with the aid of the number of characteristic values to determine whether the partial spectra fulfill a predetermined quality criterion, and adjustment parameters of the MR system are optimized on the basis of the number of partial spectra.

In accordance with the invention, an improved, automatic optimization of the shim state is provided as a result, wherein good shim settings are reliably reached in a predictable time.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for carrying out an automatic adjustment of an MR system including a plurality of receive coils, the method comprising:
setting adjustment parameters for an excitation volume of an examination object;
measuring a plurality of partial spectra, respectively of each of the plurality of the receive coils, for the excitation volume of the examination object;
evaluating the plurality of partial spectra via an algorithm, at least one respective characteristic value being determined for each respective partial spectrum of the plurality of partial spectra and a decision being made with aid of the at least one respective characteristic value for each of the plurality of partial spectra to determine whether the plurality of partial spectra fulfill a quality criterion;
optimizing the adjustment parameters for the excitation volume of the examination object via an algorithm to create optimized adjustment parameters, and repeating the measuring and evaluating with the optimized adjustment parameters, in response to the quality criterion not being fulfilled; and
measuring MR signals from the excitation volume by applying the adjustment parameters, in response to the quality criterion being fulfilled,
wherein a spatial position of at least one of the plurality of receive coils is determined and/or a spatial position of a receive volume of at least one of the plurality of receive coils relative to the examination object is determined for at least one receive coil of the plurality of receive coils,
wherein the optimizing of the adjustment parameters includes selecting adjustment parameters based upon the spatial position, of at least one of the plurality of receive coils and/or of a receive volume of at least one of the plurality of receive coils relative to the examination object, and optimizing the selected adjustment parameters, based upon the spatial position determined, and
wherein a direction is determined based upon the spatial position determined and wherein the optimizing further includes optimizing the adjustment parameters, selected based upon the selecting, based upon the direction determined such that the partial spectrum of the at least one of the plurality of receive coils in the direction fulfills the quality criterion.

2. The method of claim 1, wherein the at least one respective characteristic value, for each respective partial spectrum of the plurality of partial spectra, have half value widths of the respective ones of the plurality of partial spectra and the quality criterion is fulfilled upon a sum, a square sum or an average value of the half value widths of the partial spectra being below a threshold value.

3. The method of claim 1, wherein the at least one respective characteristic value, for each respective partial spectrum of the plurality of partial spectra, have center frequencies of the respective ones of the plurality of partial spectra, wherein center frequencies are determined for each partial spectrum of the plurality of partial spectra and wherein the quality criterion is fulfilled upon a variance of the center frequencies, or an average square distance of all the center frequencies from a global center frequency, determined from the plurality of partial spectra of all of the plurality of receive coils, being below a threshold value.

4. The method of claim 1, wherein the evaluating of the plurality of partial spectra includes a summation of all partial spectra to form an overall spectrum, and wherein the quality criterion is fulfilled upon a half value width of a measured overall spectrum being below a threshold value.

5. The method of claim 1, wherein the adjustment parameters are optimized by way of a brute-force approach, in which an overall solution space is scanned uniformly.

6. The method of claim 1, wherein the adjustment parameters are optimized via a genetic algorithm.

7. The method of claim 1, wherein the optimizing of the adjustment parameters is carried out via an optimization algorithm.

8. The method of claim 1, wherein adjustment parameters, assigned to shim channels with a stabilization time above a threshold value, are only redetermined after a plurality of repetitions.

9. The method of claim 1, wherein the at least one respective characteristic value, for each respective partial spectrum of the plurality of partial spectra, includes a plurality of characteristic values and wherein a course of the plurality of characteristic values used is displayed graphically on a graphical user interface to a user of the MR system.

10. An MR system, embodied to carry out an automatic adjustment of the MR system, comprising:
an MR control unit;
a storage unit; and
a plurality of receive coils, the storage unit being embodied to store control information executable by the MR control unit, the MR control unit being embodied, upon execution of the control information, to:
set adjustment parameters for an excitation volume of an examination object;
measure a plurality of partial spectra, respectively of each of the plurality of receive coils, for the excitation volume of the examination object;
evaluate the plurality of partial spectra via an algorithm, at least one respective characteristic value being determined for each respective partial spectrum of the plurality of partial spectra and a decision being made with aid of the at least one respective characteristic value for each of the plurality of partial spectra to determine whether the plurality of partial spectra fulfill a quality criterion;
optimize the adjustment parameters for the excitation volume of the examination object via an algorithm to create optimized adjustment parameters, and repeating the measuring and evaluating with the optimized adjustment parameters, in response to the quality criterion not being fulfilled; and
measure MR signals from the excitation volume by applying the adjustment parameters, in response to the quality criterion being fulfilled,
wherein the MR control unit is embodied to determine a spatial position of at least one of the plurality of receive coils and/or to determine a spatial position of a receive volume of at least one of the plurality of receive coils relative to the examination object for at least one receive coil of the plurality of receive coils,
wherein the MR control unit is embodied to optimize the adjustment parameters by selecting adjustment parameters based upon the spatial position, of at least one of the plurality of receive coils and/or of a receive volume of at least one of the plurality of receive coils relative to the examination object, and optimize the selected adjustment parameters based upon the spatial position determined, and wherein the MR control unit is embodied to determine a direction based upon the spatial position determined and wherein the adjustment parameters, selected based upon the selecting, are optimized based upon the direction determined such that the partial spectrum of the at least one of the plurality of receive coils in the direction determined fulfills the quality criterion.

11. A non-transitory computer program product comprising a program, directly loadable into a memory of an MR control unit of an MR system, including program segments to execute the method of claim 1 when the program is executed in the MR control unit of the MR system.

12. An non-transitory electronically readable data carrier storing electronically readable control information, configured to perform the method of claim 1 when the data carrier is used in an MR control unit of an MR system.

13. The method of claim 6, wherein the adjustment parameters are optimized by way of an initial random selection of adjustment parameters and a scanning of a solution space with the aid of the genetic algorithm.

14. The method of claim 7, wherein the optimizing of the adjustment parameters is carried out by scanning the solution space with the aid of a gradient descent method.

15. The MR system of claim 10, wherein the at least one respective characteristic value, for each respective partial spectrum of the plurality of partial spectra, have half value widths of the respective ones of the plurality of partial spectra and the quality criterion is fulfilled upon a sum, a square sum or an average value of the half value widths of the partial spectra being below a threshold value.

16. The MR system of claim 10, wherein the at least one respective characteristic value, for each respective partial spectrum of the plurality of partial spectra, have center frequencies of the respective ones of the plurality of partial spectra, wherein the MR control unit is embodied to determine center frequencies for each partial spectrum of the plurality of partial spectra and wherein the quality criterion is fulfilled upon a variance of the center frequencies, or an average square distance of all the center frequencies from a global center frequency, determined from the plurality of partial spectra of all of the plurality of receive coils, being below a threshold value.

17. The MR system of claim 10, wherein the MR control unit is embodied to evaluate of the plurality of partial spectra by including a summation of all partial spectra to form an overall spectrum, and wherein the quality criterion is fulfilled upon a half value width of a measured overall spectrum being below a threshold value.

18. The MR system of claim 10, wherein the MR control unit is embodied to optimize the adjustment parameters by way of a brute-force approach, in which an overall solution space is scanned uniformly.

19. The MR system of claim 10, wherein the MR control unit is embodied to optimize the adjustment parameters via a genetic algorithm.

20. The MR system of claim 10, wherein the MR control unit is embodied to optimize the adjustment parameters via an optimization algorithm.

\* \* \* \* \*